United States Patent [19]

Satoh

[11] Patent Number: 4,920,314
[45] Date of Patent: Apr. 24, 1990

[54] MAGNETIC RESONANCE IMAGING SYSTEM

[75] Inventor: Kozo Satoh, Yokohama, Japan

[73] Assignee: Kabushiki Kaisha Toshiba, Kawasaki, Japan

[21] Appl. No.: 164,496

[22] Filed: Mar. 4, 1988

[30] Foreign Application Priority Data

Mar. 6, 1987 [JP] Japan .................................. 62-50253

[51] Int. Cl.$^5$ ............................................ G01R 33/20
[52] U.S. Cl. .................................... 324/312; 324/309
[58] Field of Search ................. 324/309, 312, 306, 307

[56] References Cited

U.S. PATENT DOCUMENTS

| 4,021,726 | 5/1977 | Garroway et al. | 324/309 |
| 4,284,948 | 8/1981 | Young | 324/309 |
| 4,718,424 | 1/1988 | Nishimura | 324/309 |

FOREIGN PATENT DOCUMENTS

0135847A3  4/1985  European Pat. Off. .

OTHER PUBLICATIONS

R. J. Sutherland et al., "Three-Dimensional NMR Imaging Using Selective Excitement", J. Phys. E: Sci. Instrum., vol. 11, 1978, 79-83.

Primary Examiner—Hezron E. Williams
Assistant Examiner—Kevin D. O'Shea
Attorney, Agent, or Firm—Foley & Lardner, Schwartz, Jeffery, Schwaab, Mack, Blumenthal & Evans

[57] ABSTRACT

A magnetic resonance system is arranged to invert the polarity of a slicing gradient magnetic field pulse each time the selective excitation is repeated, and additively combine two types of imaging data corresponding to the opposite polarities of the slicing gradient field pulse to form a magnetic resonance image.

9 Claims, 7 Drawing Sheets $$H = K \frac{\sin 2\pi ft}{t}$$

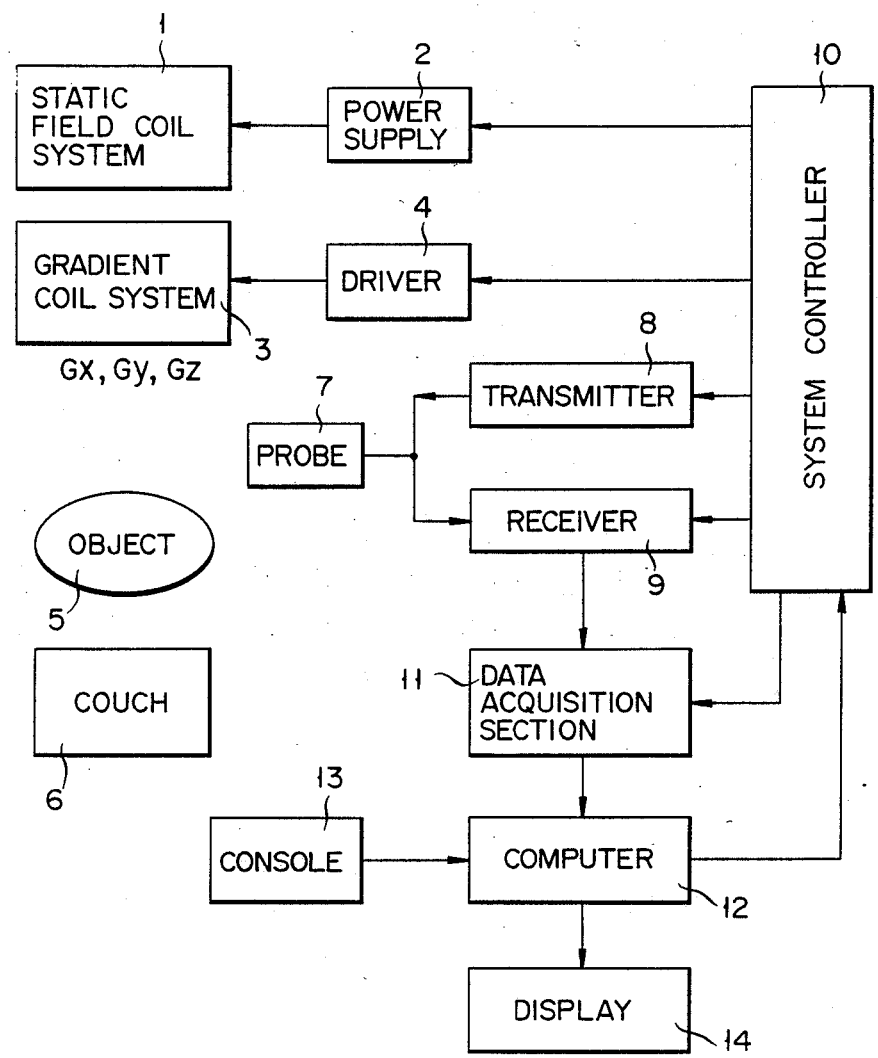
F I G. 4

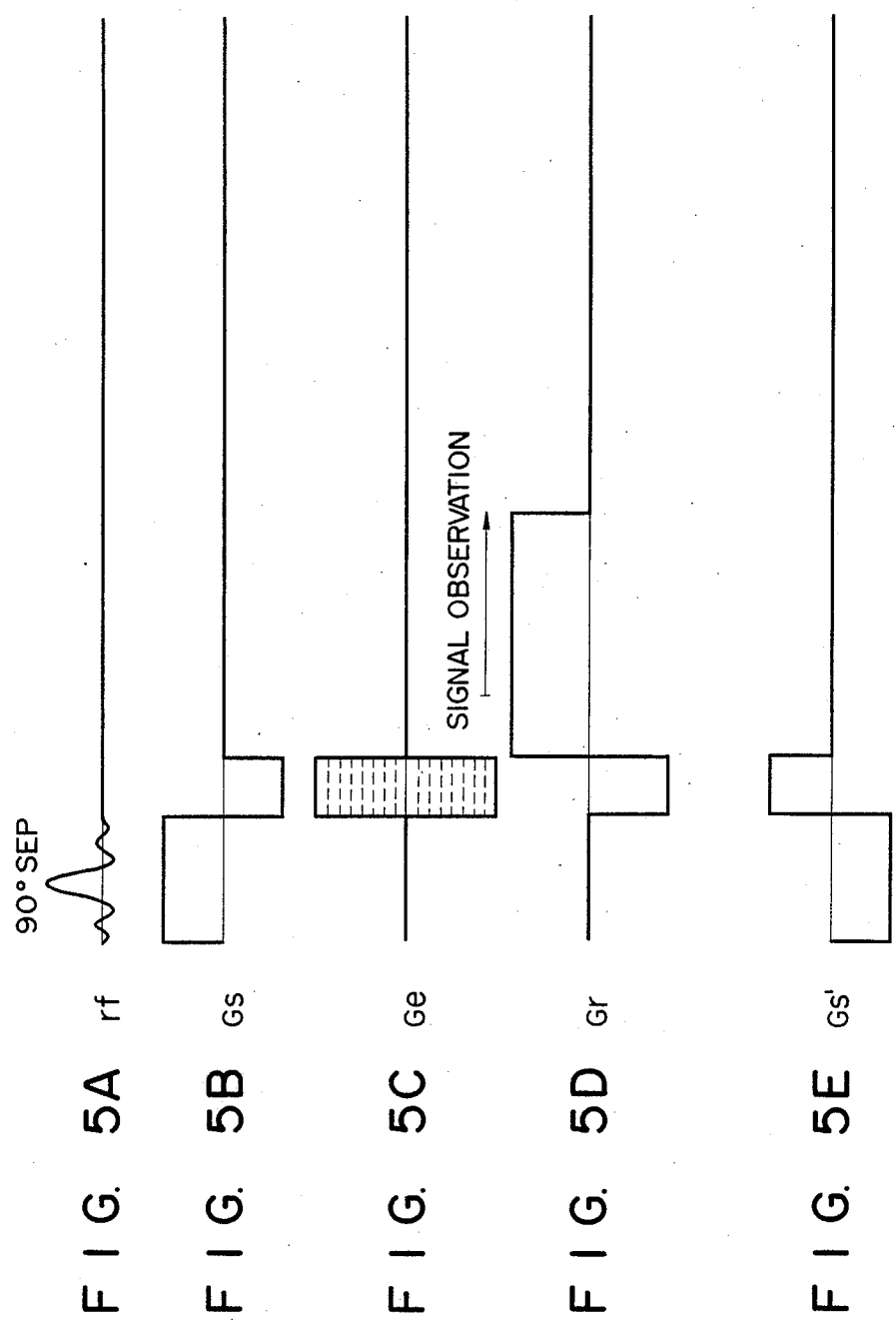

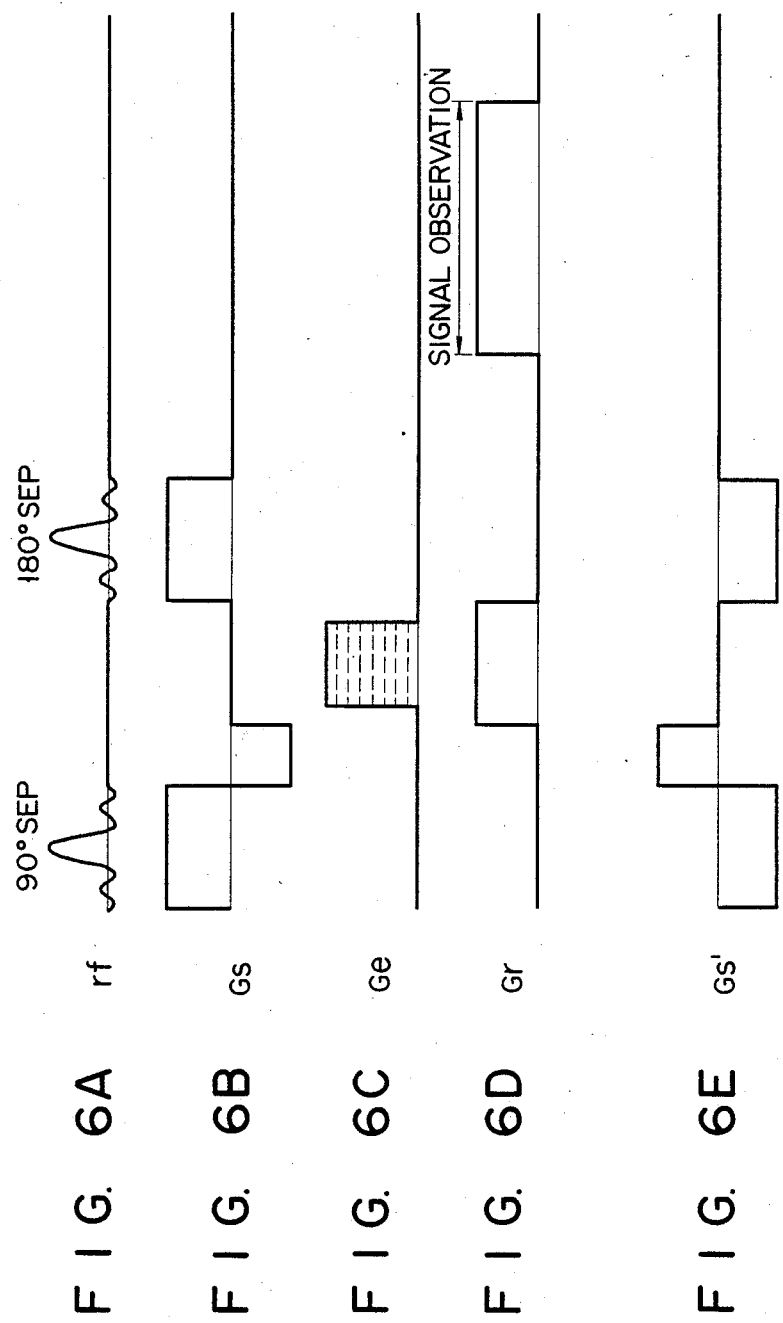

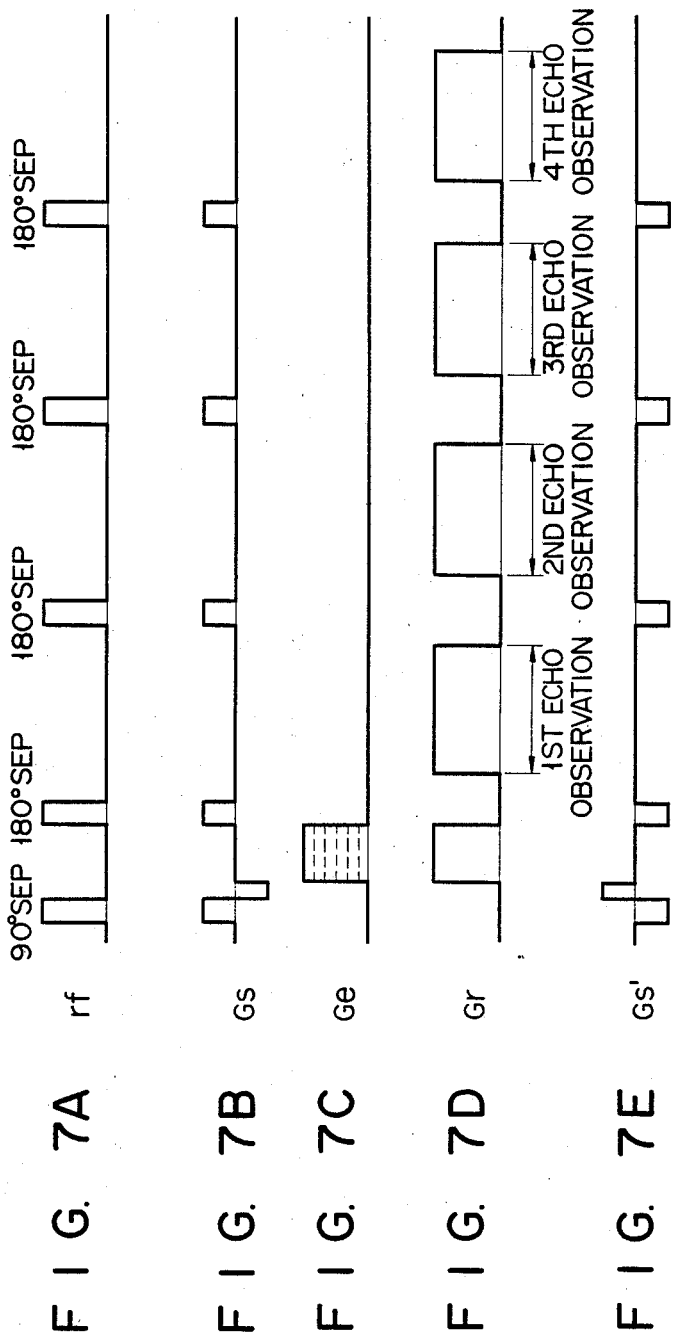

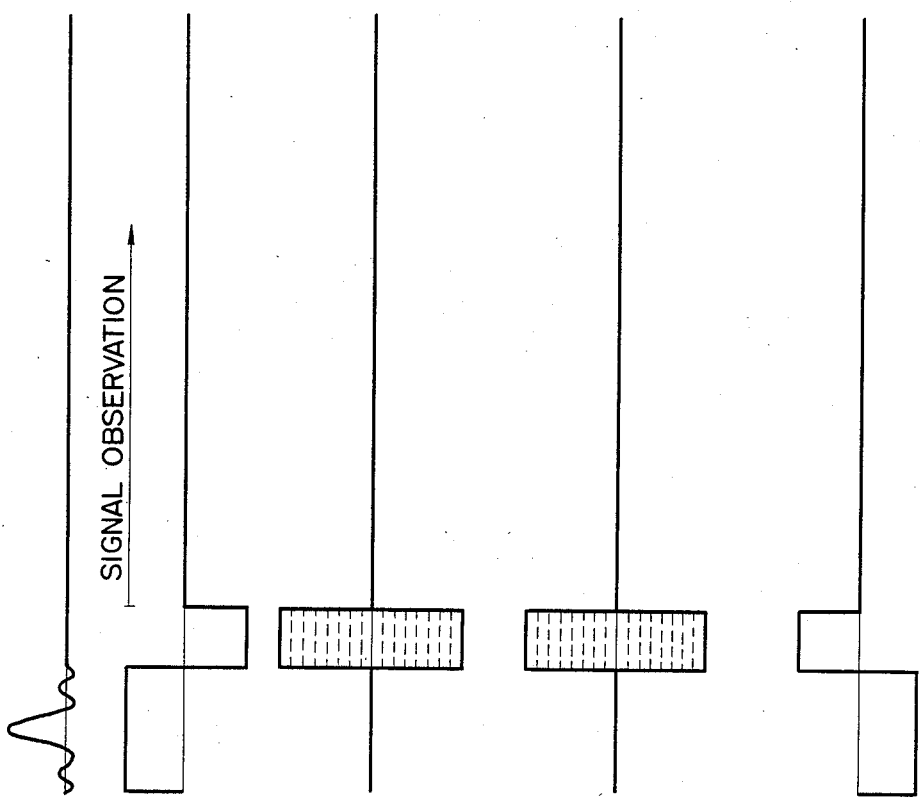
FIG. 8A rf
FIG. 8B Gs
FIG. 8C Ge1
FIG. 8D Ge2
FIG. 8E Gs'

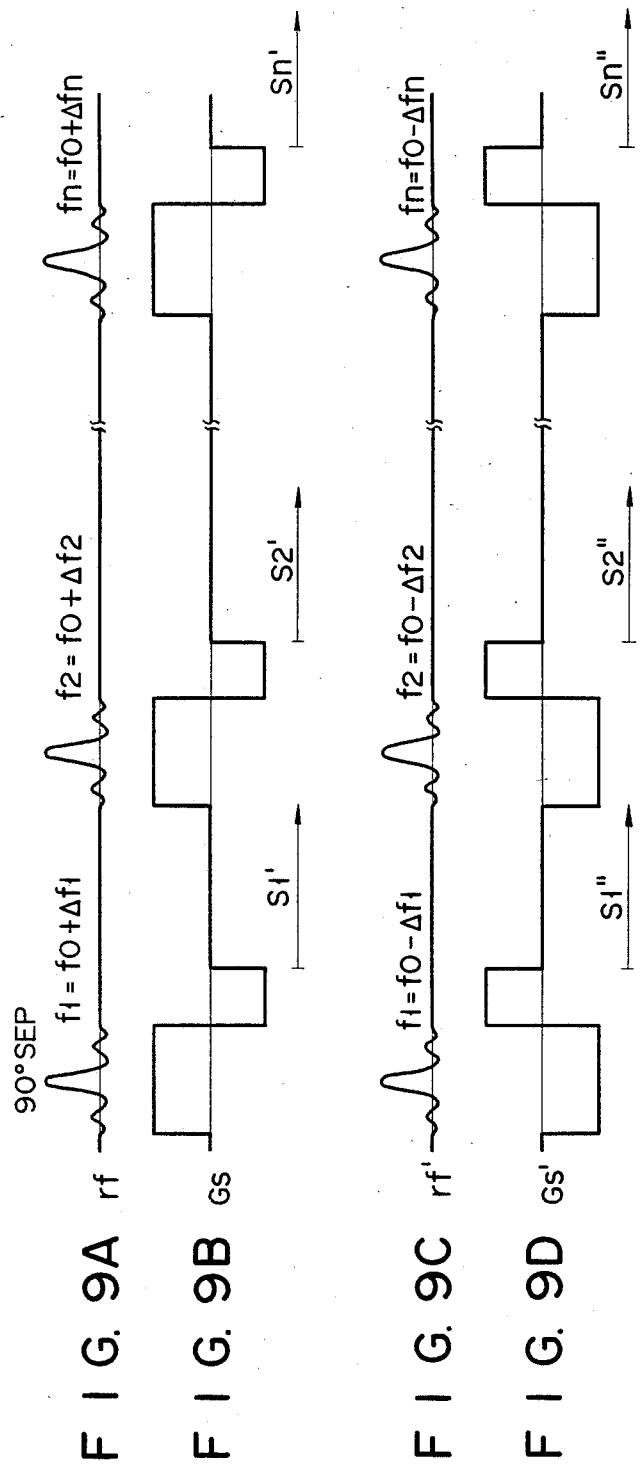

MAGNETIC RESONANCE IMAGING SYSTEM

BACKGROUND OF THE INVENTION

1. Field of Invention

This invention relates to a magnetic resonance imaging (MRI) system for obtaining a tomographic image of a slice of interest of an object under examination using the magnetic resonance phenomenon, and more particularly to a magnetic resonance imaging system capable of improving slicing characteristics.

2. Description of the Related Art

As is well known, magnetic resonance imaging is a method for obtaining chemical and physical microscopic distribution information of particles utilizing a phenomenon in which, when placed in a homogeneous static magnetic field (its intensity is H0), atomic nuclei having a specific magnetic moment, namely a group of nuclear spins, resonantly absorb high-frequency magnetic-field energy rotating in a plane orthogonal to the direction of the static magnetic field at an angular velocity ω0 defined by ω0=γH0 (γ is the gyromagnetic ratio which is a constant specific to each type of atomic nucleus.)

As magnetic resonance imaging methods of imaging the spatial distribution of particular atomic nuclei (e.g. hydrogen atomic nuclei in water and fat), the projection reconstruction method by Lauterbur, the Fourier imaging methods by Kumar, Welti, Ernst or others, and the spin warp method (this is a modification of the Fourier method) by Hutchison et al. have been devised.

In such magnetic resonance imaging methods, a slicing technique is widely used which depends on the so-called selective excitation method to selectively excite magnetization in a slice of interest in a three-dimensional region so as to cause the magnetic resonance phenomenon, and to acquire magnetic resonance signals.

In the case of the selective excitation method the excitation of the magnetic resonance phenomenon is achieved in the following way:

An object placed in a uniform static magnetic field is further subjected to a linear magnetic field gradient acting as a slicing gradient magnetic field whose intensity varies linearly in the direction orthogonal to the slice-plane of interest. Owing to the magnetic field gradient of the magnetic resonance frequency, which corresponds to the intensity of the magnetic field, linearly varies in the direction orthogonal to the slice plane. Under this condition, in order to excite and refocus the magnetization in the slice, the slice is subjected to a pulsed high-frequency magnetic field, or a high-frequency pulse which has a frequency bandwidth corresponding to the slice thickness and a center frequency corresponding to the magnetic resonance frequency at the center of the slice thickness. In this case, an exciting high-frequency pulse adapted for rotating the magnetization (vector) by 90 degrees by resonant absorption is referred to as a 90-degree selective excitation pulse (90° SEP), while a high-frequency pulse adapted for rotating the magnetization by 180 degrees (reversing) or refocusing it is referred to as a 180-degree selective excitation pulse (180° SEP).

When the magnetization in the slice is excited and refocused by selective excitation pulses, the satisfactory selectivity of the slice (called slicing characteristic) cannot be always obtained. That is, the normally used selective excitation pulses are not such optimum ones as to rotate by 90 degrees or 180 degrees the magnetization in the slice of interest alone. To obtain an optimum slicing characteristic, or a sharp slicing characteristic, an attempt is made to optimize the waveform of the selective excitation pulses which includes the shape of an envelope of amplitude modulation and a high-frequency waveform of phase modulation. Or, another attempt is made to use a composite selective excitation pulse system employing a set of a plurality of excitation pulses. As described, to obtain a sharp slicing characteristic various means have been employed conventionally, but satisfactory results have not been obtained as yet.

It is important that the rotation phases of the magnetizations (magnetization vectors) are made coincident with each other at points located in a slice by the selective excitation of magnetic resonance and the echo refocusing. However, in the case of a general object, or an object in which the distribution of density is not uniform with respect to the direction orthogonal to the slice plane, the above-described magnetization phase condition cannot be obtained. The variations in phase of the magnetization in the slice plane generate image artifacts or false images, thus degrading the image quality.

Accordingly, in the conventional magnetic resonance imaging system, not only the poor slicing characteristic but also the artifacts due to the variations in phase of the magnetization in the slice plane degrade the image quality. In recent years the signal-to-noise ratio and the spatial resolution of magnetic resonance images have been substantially improved. Thus, solving the problems resulting from the slicing characteristic and the variations in phase of the magnetization in the slice will be the key to an improvement in the magnetic resonance image quality.

On the other hand, attempts have also been made to measure blood flow utilizing magnetic resonance phase information in the magnetic resonance imaging system. The variations in phase of the magnetization in the slice is an important factor which reduces the accuracy of measurement.

With the existing MRI system, as described above, there are problems of degradation in the image quality and poor accuracy of the measurements due to poor slicing characteristic and variations in the phase of the magnetization in a slice.

SUMMARY OF THE INVENTION

Accordingly it is a primary objective of this invention to provide a magnetic resonance imaging system arranged to improve the slicing characteristic in the selective excitation, and to decrease the variation in the magnetization phases in a slice.

The magnetic resonance imaging system of this invention is arranged to invert the polarity of the waveform of an applied slicing gradient magnetic field for each repetition of the selective excitation. The system comprises an image processor arranged to acquire a magnetic resonance signal of an excited slice, obtain imaging data through the quadrature detection of the magnetic resonance signal, and obtain a magnetic resonance image from the imaging data. In particular, the image processor is arranged to add two types of imaging data corresponding to the opposite polarities of the slicing gradient magnetic field to form a magnetic resonance image.

The inversion of the polarity of the slicing gradient magnetic field for the selective excitation leads to the inversion of the sign of that part of the imaging data which corresponds to the imaginary part of the distribution function, obtained by quadrature detection of the magnetic resonance signal. Accordingly, simple addition or the arithmetic mean of the two types of imaging data cancels out the imaginary parts thereof which degrade the slicing characteristic and cause phase variation. As a result of the simple addition or arithmetic mean, only that part of imaging data which corresponds to the real part of the distribution function remains. Thus, the imaging system enables the slice characteristic to improve and the phase variation in the slice to decrease. Consequently, improvements in the quality of magnetic resonance images and the accuracy of measurements using phase information are achieved.

BRIEF DESCRIPTION OF THE DRAWINGS

FIG. 4 is a block diagram of a magnetic resonance imaging system according to an embodiment of this invention;

FIGS. 5A through 5E illustrate a pulse sequence in the case where this invention is applied to the spin-warp method for observing an FID (free induction decay) signal;

FIGS. 6A through 6E illustrate a pulse sequence in the case where this invention is applied to the spin warp method for observing a spin-echo signal;

FIGS. 7A through 7E illustrate a pulse sequence in the case where this invention is applied to the modified Carr-Purcell method;

FIGS. 8A through 8E illustrate a pulse sequence in the case where this invention is applied to the chemical shift imaging for observing an FID signal; and FIGS. 9A through 9D illustrate a pulse sequence in the case where this invention is applied to the multi-slice method for observing an FID signal.

DETAILED DESCRIPTION OF THE PREFERRED EMBODIMENTS

First, the principle of this invention will be discussed using numerical expressions.

Suppose that a rotating magnetic field (high frequency magnetic field) applied in the direction of x'-axis in the rotating coordinate system is $\omega 1(t)$, and a slicing gradient magnetic field applied in the direction perpendicular to the slice plane is $\Delta\omega(z)$ ($=\gamma G Z$). Then the Bloch equations for the selective excitation method used in the magnetic resonance imaging system would been given by $$dmx'(z)/dt = -\Delta\omega(z)my'(z)$$

$$dmy'(z)/dt = \Delta\omega(z)mx'(z) + \omega 1(t)mz'(z)$$

$$dmz'(z)/dt = -\omega 1(t)my'(z) \quad (1)$$

where mx', my', and mz' are magnetization vector components in the directions of x', y', and z' coordinate axes of the rotating coordinate system (which usually has as its axis of rotation the z axis of the rectangular coordinate system, in which case the z'-axis is coincident with the z-axis.)

Figure 1:
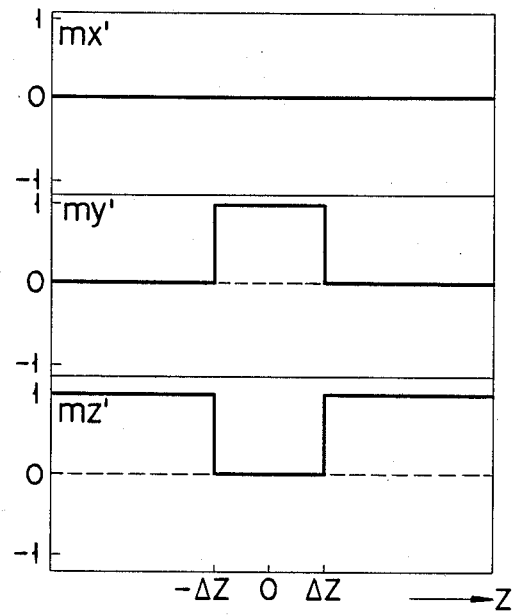
FIG. 1 is a diagram for explaining a slice characteristic for an optimum selective excitation pulse.
Figure 2:
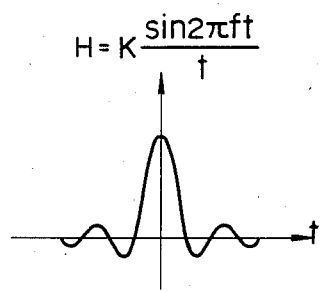
FIG. 2 shows the waveform of a SINC function used as the envelope waveform of a selective excitation pulse.
Figure 3:
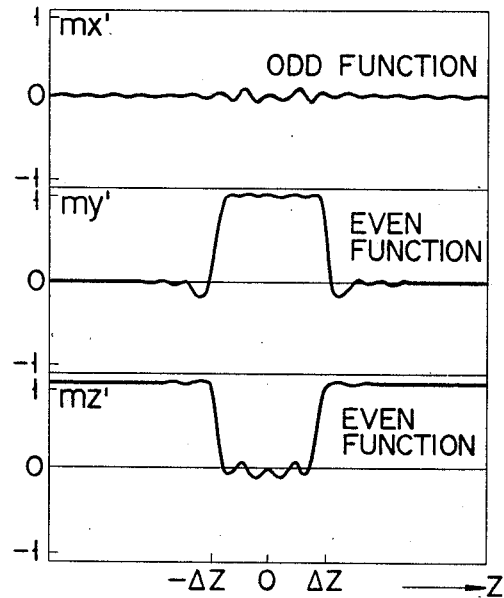
FIG. 3 is a diagram for explaining the slice characteristic obtained when the selective excitation pulse with the waveform of FIG. 2 is used.

The case where $-z$ is provisionally substituted for z, i.e. $z \to -z$ will be discussed here. In this case, it is seen that equations (1) are satisfied by such substitutions that $mx' \to -mx'$, $my' \to my'$, and $mz' \to mz'$. That is, $$mx'(-z) = -mx'(z)$$

$$my'(-z) = my'(z)$$

$$mz'(-z) = mz'(z) \quad (2)$$

where mx' is an odd function of z, and my' and mz' are each an even function of z.

mx', my', and mz' are shown in FIG. 1 under the assumption that an optimum 90° selective excitation pulse is used. On the other hand, a sinc-function waveform of $-4\pi \sim +4\pi$ as shown in FIG. 2 is used often in practice as an envelope waveform of the selective excitation pulse. Computer simulation using the selective excitation pulse with the envelope of FIG. 2 yields mx', my', and mz' as shown in FIG. 3. According to a comparison between mx', my', and mz' of FIG. 3 and mx', my', and mz' of FIG. 1, it will be understood that, in the case of FIG. 3, a component of mx' which is an odd function is produced. This mx' component causes the degradation in the slice characteristic and the variation in the magnetization phase.

Now, supposing that the three-dimensional distribution of nuclear spins in an object is represented by $\rho(x, y, z)$, the two-dimensional distribution of nuclear spins $\bar{\rho}(x, y)$ in a slice is $$\bar{\sigma}(x, y) = \int \rho(x, y, z)\{my'(z) + i \, mx'(z)\} \, dz \quad (3)$$
$$= \bar{\rho}_r(x, y) + i\bar{\rho}_i(x, y)$$

Where $\rho(x, y, -z)$ is equal to $\rho(x, y, z)$, since $\bar{\rho}i(x, y) = 0$, $\bar{\rho}(x, y)$ becomes a real function. An observed magnetic resonance signal is represented by:

$$S(t_x, t_y) = \int \bar{\rho}(x, y) e^{-i(t_x \cdot x + t_y \cdot y)} dx \, dy$$

where $t_x$ denote read-out time and $t_y$ denote encode time. The data of $S(t_x, t_y)$ is obtained by quadrature-detection of the magnetic resonance signal. In the case of $\bar{\rho}(-x, -y) = \bar{\rho}(x, y)$, $S(t_x, t_y)$ becomes a real function. In general, $S(t_x, t_y)$ is a complex function.

If the slice plane has phase variation $\Delta\psi$, the observed magnetic resonance signal $\tilde{S}(t_x, t_y)$ obtained by the Fourier method or the spin-warp method is:

$$\tilde{S}(t_x, t_y) = e^{i\Delta\psi} S(t_x, t_y)$$

By processing $\tilde{S}(t_x, t_y)$ by the two-dimensional Fourier transformation, the following formula is obtained:

$$\tilde{\rho}(x, y) = e^{i\Delta\psi}(\bar{\rho}_r + i\bar{\rho}_i)$$

Therefore, the absolute value image is represented by:

$$|\tilde{\rho}(x, y)| = (\bar{\rho}_r^2 + \bar{\rho}_i^2)^{\frac{1}{2}}$$

It should be noted that $\bar{\rho}_i$ deriving from the abovementioned mx' is included in the absolute value image.

On the other hand, where the polarity of the slicing gradient magnetic field is inverted in accordance with this invention as described above, namely $\Delta\omega$ $(z) \rightarrow -\Delta\omega (z)$, equations (1) can be satisfied by the substitutions $mx' \rightarrow -mx'$, $my' \rightarrow my'$, $mz' \rightarrow mz'$. In other words, when the polarity of the slicing gradient magnetic field is inverted the sign of my' and mz' remains unchanged, but the sign of mx' changes. Accordingly, the addition (simple addition or arithmetic mean) of first image data S+ obtained under the slicing gradient magnetic field of a first polarity and second imaging data S− obtained under the slicing gradient magnetic field of a second polarity opposite to the first polarity would produce a signal S.

This addition will be explained by the following formulae:

$$S^+(t_x, t_y) = \int \{\bar{p}_r(x,y) + i\bar{p}_i(x,y)\} e^{-i(t_x \cdot x + t_y \cdot y)} dx\, dy$$

$$S^-(t_x, t_y) = \int \{\bar{p}_r(x,y) - i\bar{p}_i(x,y)\} e^{-i(t_x \cdot x + t_y \cdot y)} dx\, dy$$

$$\begin{aligned} S &= S^+ + S^- \\ &= 2 \int \bar{p}_r(x,y) e^{-i(t_x \cdot x + t_y \cdot y)} dx\, dy \end{aligned}$$

As can be understood from the above formulae, the term "$\bar{p}_i$" is cancelled.

The signal S corresponds to the two-dimensional distribution indicated below.

$$\bar{p}(x, y) = 2 \int \rho(x, y, z) my'(z) dz \quad (4)$$

The distribution in equation (4) is real, involving no imaginary part, i.e. mx' component. Let us consider the case where the slice plane has variation $\Delta\psi$. Since $\bar{p}_i = 0$ in this case, $\bar{S}(t_x, t_y)$ can be transformed as follows as a result of the two-dimensional Fourier transformation:

$$\bar{p}(x,y) = e^{i\Delta\psi} \bar{p}_r(x,y)$$

The absolute value image is represented by:

$$|\bar{p}(x,y)| = |\bar{p}_r|$$

Therefore, correct distribution information of nuclear spins can be obtained.

Therefore, when a magnetic resonance image is reconstructed by the new imaging data, the degradation of the slice characteristic and the phase variation in the slice plane do not occur even in the absolute value image. In the above, the reconstruction based on the two-dimensional Fourier transformation was mentioned as being performed after the data S+ and data S− were added together. Needless to say, however, the reconstruction of data S+ and that of data S− maybe performed before they are added together.

FIG. 4 shows an arrangement of the magnetic resonance imaging system of this invention based on the above-described principle.

The magnetic resonance imaging system of FIG. 4 comprises a static field coil system 1, a power supply 2, a gradient coil system 3, a driver 4, an examination table or couch 6, a probe 7, a transmitter 8, a receiver 9, a system controller 10, a data acquisition section 11, a computer 12, a console 13, and a display 14.

Static field coil system 1 is driven by power supply 2 to produce a static magnetic field, while gradient coil system 3 is driven by driver 4 to produce gradient magnetic fields. Power supply 2 and driver 4 are controlled by system controller 10. An object (e.g. patient) 5 lying on couch 6 is subjected to the uniform static magnetic field produced by static field coil system 1. Gradient coil system 3 applies to object 5 gradient magnetic fields Gx and Gy whose intensity linearly varies in the x and y directions orthogonal to each other in the plane of a slice of interest, and a gradient magnetic field Gz whose intensity linearly varies in the z direction orthogonal to the slice plane.

Object 5 is further irradiated with a high-frequency magnetic field transmitted from probe 7 by a high-frequency signal output from transmitter 7. Transmitter 8 also is controlled by system controller 10. A magnetic resonance signal detected and received by probe 7 is applied to receiver 9 to be amplified and quadrature-detected therein. Imaging data obtained by amplification and quadrature-detection is transferred from receiver 9 to data acquisition section 11. Receiver 9 and data acquisition section 11 are controlled by system controller 10. Data acquisition 11 acquires the imaging data from receiver 9 and then transfers it to computer 12 after analog-to-digital conversion.

On the basis of the imaging data from data acquisition section 11, computer 12 executes image reconstruction processing to produce magnetic resonance image data. Computer 12 controls system controller 10. An operator operates computer 12 through console 13. Display 14 is responsive to the magnetic resonance image data from computer 12 to display an magnetic resonance image.

FIGS. 5A–5E, FIGS. 6A–6E, FIGS. 7A–7E, FIGS. 8A–8E, and FIGS. 9A–9D show some exemplary pulse sequences in the case where this invention is applied to the spin-warp method. These pulse sequences are controlled by system controller 10. In the case of the spin-warp method, in order for positional information necessary to image formation to be included in the magnetic resonance image signal, the positional information is encoded with phase (phase encoded) with respect to a first direction in the slice plane, but is encoded with frequency with respect to a second direction normally orthogonal to the first direction in the slice plane. The phase encoding is achieved by varying, each time the excitation is repeated, the amplitude of the gradient magnetic field (the magnitude of the gradient) along the first direction at the time of excitation of magnetic resonance. The frequency encoding is achieved by applying a gradient magnetic field in the second direction when the magnetic resonance signal is acquired.

FIGS. 5A–5E show the pulse sequence used in the case where this invention is applied to the spin warp method utilizing an FID signal as the magnetic resonance signal. In the first step (FIGS. 5A–5D), the excitation of magnetic resonance and the acquisition of magnetic resonance signal are carried out as follows. The 90° selective excitation pulse (90° SEP) as high-frequency pulse rf and the slicing gradient magnetic field Gs with a predetermined amplitude are simultaneously applied to the object. Subsequently, the encoding gradient magnetic field Ge is applied. And then a reading gradient magnetic field Gr is applied to observe a magnetic resonance signal which is, in this case, the FID signal. To compensate for dispersion of the magnetization vectors due to the slicing gradient magnetic field Gs, as shown, the gradient magnetic field Gs being applied to the object is inverted after application of the high-frequency pulse rf, and the reading gradient magnetic field Gr applied to the object is inverted before the magnetic resonance signal is read out.

Next, in the second step (FIGS. 5A, 5C–5E), in lieu of the slicing gradient magnetic field Gs, a slicing magnetic field Gs' as shown in FIG. 5E is used whose polarity is opposite to that of Gs. The 90° selective excitation pulse, the phase encoding gradient magnetic field Ge and the reading gradient magnetic field Gr are applied to the object as in the first step. That is, the slicing gradient magnetic field Gs' has the same amplitude as the field Gs used in the first step, but has its polarity inverted. The 90° pulse, the polarity-inverted field Gs', the phase encoding field Ge, and the reading field Gr are applied to the object as shown to observe an FID signal.

The phase encoding gradient magnetic field Ge has its amplitude sequentially varied every two steps (the first and second steps) as shown by dotted lines. And by repeating the first and second steps alternately, two types of imaging data corresponding to the slicing gradient magnetic fields Gs and Gs' are transferred from data acquisition section 11 to computer 12 to be stored in a memory therein.

Computer 12 additively combines the two types of imaging data stored in the memory by simple addition or arithmetic mean to produce new imaging data. The new imaging data reflects the slice characteristic corresponding to the my'-component which is an even function, but is free from the effect of the mx'-component which is an odd function.

Accordingly, the slice characteristic is improved, and the variations in the phase of the magnetization is reduced. As a result, the quality of magnetic resonance images can be improved, and the accuracy of measurements using phase information such as blood flow measurements can be increased.

FIGS. 6A–6E show the pulse sequence used in the case where this invention is applied to the spin-warp method utilizing a spin echo signal as the magnetic resonance signal. FIGS. 7A–7E show the pulse sequence used in the case where this invention is applied to the spin-warp method using the modified Carr-Purcell method. In these cases, two types of imaging data corresponding to the slicing gradient magnetic fields Gs and Gs', which are opposite in polarity, are additively combined to produce imaging data free from the component of mx'.

In the case of FIGS. 6A–6E, after the 90° pulse has been applied to the object along with the slicing gradient magnetic field Gs or Gs' the phase-encoding field Ge is applied. Subsequently, the 180° pulse (180° SEP) is applied along with the slicing field Gs or Gs', and then the reading field Gr is applied to the object for echo signal observation.

In the case of FIGS. 7A–7E, after the first echo has been observed as in the case of FIGS. 6A–6E, the 180° pulse and the slicing field Gs or Gs' are applied and then the reading field Gr is applied to observe an echo. This echo observation is repeated to observe the second, third, fourth, and subsequent echos. Imaging data obtained from these echos are used to obtain an image of the transverse relaxation time $T_2$.

FIGS. 8A–8E show the pulse sequence used in the case where this invention is applied to the chemical-shift imaging based on the spin-warp method utilizing an FID signal as the magnetic resonance signal. In this case also, two types of imaging data which correspond to the slicing fields Gs and Gs' and which are obtained under the same encoding condition determined by phase encoding gradient magnetic fields Ge1 and Ge2, are additively combined to produce imaging data which is unaffected by mx'.

In the case of FIGS. 8A–8E, after the 90° pulse and the slicing field Gs or Gs' are applied for selective excitation, encoding gradient magnetic fields Ge1 and Ge2 are applied for phase encoding. Subsequently, the magnetic resonance signal is observed.

FIGS. 9A–9D show the pulse sequence used in the case where this invention is applied to the multi-slicing method utilizing an FID signal as the magnetic resonance signal. In the drawing only the waveforms of high-frequency pulse and slicing gradient magnetic field are illustrated, and the waveforms of phase encoding field and the reading field are excluded from illustration. In the case of the multi-slice method also, use is made of slicing gradient magnetic fields Gs and Gs' which are opposite in polarity.

In the multi-slicing method, however, portions other than $z=0$ (Gs=0) are also excited. Thus, when the rf pulse frequency, in the case where the slicing gradient magnetic field Gs is applied, is equal to that in the case where the slicing field Gs' is applied, slices disposed symmetrically with respect to the $z=0$ slice will be excited. In order to excite the same slice plane, therefore, where the rf pulse frequency is $f1=f0+\Delta f1$ when Gs is applied, the rf' pulse frequency is selected to be $f1=f0-\Delta f1$ when Gs' is applied. When representing magnetic resonance signals corresponding to the slicing field Gs by S1', S2', ..., Sn', and magnetic resonance signals corresponding to the slicing field Gs' by S1'', S2'', ..., Sn'', imaging data for the respective slice planes are given by $S1=S1'+S1''$, $S2=S2'+S2''$, ..., $Sn=Sn'+Sn''$ which are free from the effect of mx'.

This invention is also applicable to the multi-slicing method using a spin-echo signal or multi-echo signals as the magnetic resonance signal.

The excitation of magnetic resonance and the acquisition of imaging data based on the pulse sequences as shown in FIGS. 5a–5E, FIGS. 6A–6E, FIGS. 7A–7E, and FIGS. 8A–8E are carried out in a more practical manner as follows:

(a) Where the averaging is carried out 2N times

In the encoding step, a predetermined pulse sequence is repeated N times (N=1, 2) for the slicing field Gs, and the resulting N pieces of imaging data are accumulated. In this way, imaging data are found for all the encoding steps. Let $R^+$ and $I^+$ represent real and imaginary parts of these imaging data, respectively. Similarly, imaging data are found for the slicing field Gs'. Let $R^-$ and $I^-$ represent real and imaginary parts, respectively, of the imaging data for Gs', thus obtained. R and I can be found from $R=R^+ +R^-$, and $I=I^+ +I^-$. By two-dimensional Fourier-transforming $(R+iI)$ two-dimensional distribution information can be found.

Besides, after data based on the slicing fields Gs and Gs' have been obtained in an encoding step, encoding steps may be sequentially advanced to alternately acquire data based on the slicing fields Gs and Gs'.

(b) The case without averaging

The slicing gradient magnetic field Gs is used for even encoding steps $K=2n$ (n=1, 2, ..., M), while the slicing gradient field Gs' is used for odd encoding steps $k=2n+1$ (n=0, 1, M−1). Suppose that the real part and the imaginary part of (M×2M) matrix data obtained by slicing gradient field Gs are $R^{+0}$ and $I^{-0}$, respectively. Then data $R^+$ and $I^+$ of (2M×2M) matrix can be obtained from odd-encode data obtained through interpolation. Similarly, suppose that the real part and the imaginary part of data obtained by slicing gradient field Gs' are $R^{-0}$ and $I^{-0}$, respectively. Then $R^-$ and $I^-$ can be found. Thus, $R=R^+ + R^-$ and $I=I^+ + I^-$ are obtained. $R+iI$ is subjected to the two-dimensional Fourier transform to obtain two-dimensional distribution information.

In addition, for example, use may be made of a method of acquiring odd-numbered order data first, and then acquiring even-numbered order data, or a method of acquiring odd-numbered data and even-numbered data in an interlace manner.

This invention can be effectively applied to MR angiography in which subtraction is made between an MR image obtained by the sequence including a flow-encode pulse (i.e., bipolar gradient field pulse) and an MR image obtained by the sequence not including a flow-encode pulse. In the case of the MR angiography moving portion such as blood can be distinguished in phase from other (stationary) portion without using the contrast medium, by inserting a flow-encode pulse into the pulse sequence.

In the case of 2N-time averaging, suppose that data corresponding to two images (i.e., the MR image obtained by the sequence including a flow encode pulse and the MR image obtained by the sequence including no flow encode-pulse) are A and B, respectively, and data acquired in each encoding step are a and b. Further, suppose that + and − are added to data acquired for the slicing gradient fields Gs and Gs', respectively. Then, the following mode may be affected.

(1) the encoding steps are advanced to repeat the data collection in the following order $(a^+ \rightarrow a^- \rightarrow b^+ \rightarrow b^-)$.

(2) the encoding steps are advanced to repeat the data collection in the following order $(a^+ \rightarrow b^+ \rightarrow a^- \rightarrow b^-)$.

$A=A^+ + A^-$, $B=B^+ + B^-$ are obtained from data $A^+$, $A^-$, $B^+$, $B^-$ obtained in (1) and (2). And then A-B is two-dimensional Fourier transformed.

(3) Data are acquired in the order of $A^+ \rightarrow B^+ \rightarrow A^- \rightarrow B^-$ to obtain $A=A^+ + A^-$, $B=B^+ + B^-$. Then A-B is two-dimensional Fourier transformed.

In the case of no averaging, (1) data of A in the odd-numbered order encoding steps for Gs, data of A in the even-numbered order encoding steps for Gs', data of B in the odd-numbered order encoding steps for Gs, and data of B in the even-numbered order encoding steps for Gs' are successively acquired. This data acquisition is repeated. (2) After data of A in the odd-numbered order encoding steps for Gs, and data of A in the even-numbered order encoding steps for Gs' are repeatedly acquired, data of B in the odd-numbered order encoding steps for Gs, and data of B in the even-numbered order encoding steps for Gs' are repeatedly acquired. (3) $a^+$ and $b^+$ in the odd-numbered steps and $a^-$ and $b^-$ in the even-numbered steps are repeatedly acquired.

In the case where $\bar{p}(x, y)$ is a real function, magnetic resonance imaging data $S(t_x, t_y)$ can satisfy the relationship below:

$$S(-t_x, -t_y) = S^*(t_x, t_y)$$

where * denotes a complex conjugate.

Therefore, if only data about half of the Fourier space is obtained, the other half can be calculated. As a result, the time required for data collection can be reduced to half, in comparison with the case of a full encoding method wherein the entire Fourier space is scanned.

In the case of the present invention, $\bar{p}(x, y)$ is a real function, so that the half encoding method noted above can be applied.

This invention may be embodied in still other ways without departing from the spirit thereof.

What is claimed is:

1. A magnetic resonance imaging system comprising:
   static magnetic field generating means for generating a static homogeneous magnetic field;
   slicing gradient magnetic field-generating means for generating a slicing gradient magnetic field whose intensity varies linearly in a direction orthogonal to a slice of interest of an object to be examined, the slicing gradient magnetic field being superimposed on the static magnetic field;
   encoding gradient magnetic field-generating means for generating a phase encoding gradient magnetic field whose intensity varies linearly in a predetermined direction in a plane of the slice of interest, the encoding gradient magnetic field being superimposed on the static magnetic field;
   reading gradient magnetic field-generating means for generating a reading gradient magnetic field whose intensity varies linearly in a predetermined direction which is in the plane of the slice of interest but is different from the direction of the encoding gradient magnetic field, the reading gradient magnetic field being superimposed on the static magnetic field;
   transmitting and receiving means for transmitting high frequency pulses including a selective excitation pulse for exciting magnetic resonance in the slice of interest, and receiving a magnetic resonance signal resulting from magnetic resonance phenomenon excited by the high frequency pulses;
   data acquisition means for acquiring magnetic resonance signal data received by the transmitting and receiving means;
   sequence control means for driving in a predetermined pulse sequence the slicing gradient magnetic field-generating means, the encoding gradient magnetic field-generating means, the reading gradient magnetic field-generating means, the transmitting and receiving means and the data acquisition means such that the magnetic resonance is excited each time an encoding step determined by the amplitude of the encoding gradient magnetic field is performed and that the data acquisition means acquires the magnetic resonance signal resulting from the magnetic resonance; and
   image reconstructing means responsive to the data acquired by the data acquisition means for reconstructing a magnetic resonance image, wherein
   said sequence control means producing, with respect to one magnetic resonance image, two types of pulse sequences in which slicing gradient magnetic field pulses are opposite in polarity; and
   said reconstructing means including additive combining means for additively combining data based on the two types of pulse sequences to reconstruct said one magnetic resonance image.

2. A system of claim 1, wherein the sequence control means operates in accordance with the pulse sequence of a spin warp method.

3. A system of claim 1, wherein the sequence control means operates in accordance with the pulse sequence of a modified Carr-Purcell method.

4. A system of claim 1, wherein the sequence control means operates in accordance with the pulse sequence of a multi-slicing method.

5. A system of claim 1, wherein the sequence control means executes, at each of the encoding steps, two types of the pulse sequences using opposite polarities of the slicing gradient magnetic field.

6. A system of claim 1, wherein the sequence control means inverts, after one of the two types of the pulse sequences has been completed, the polarity of the slicing gradient magnetic field pulse to carry out the other of the pulse sequences.

7. A system of claim 1, wherein the additive combining means additively combines data preceding the image reconstruction processing.

8. A system of claim 1, wherein the additive combining means additively combines data succeeding the image reconstruction processing.

9. A magnetic resonance imaging system comprising:
   static magnetic field generating means for generating a static homogeneous magnetic field;
   slicing gradient magnetic field-generating means for generating a slicing gradient magnetic field whose intensity varies linearly in a direction orthogonal to a slice of interest of an object to be examined, the slicing gradient magnetic field being superimposed on the static magnetic field;
   encoding gradient magnetic field-generating means for generating a phase encoding gradient magnetic field whose intensity varies linearly in a predetermined direction in a plane of the slice of interest, the encoding gradient magnetic field being superimposed on the static magnetic field;
   reading gradient magnetic field-generating means for generating a reading gradient magnetic field whose intensity varies linearly in a predetermined direction which is in the plane of the slice of interest but is different from the direction of the encoding gradient magnetic field, the reading gradient magnetic field being superimposed on the static magnetic field;
   transmitting and receiving means for transmitting high frequency pulses including a selective excitation pulse for exciting magnetic resonance in the slice of interest, and receiving a magnetic resonance signal resulting from magnetic resonance phenomenon excited by the high frequency pulses;
   data acquisition means for acquiring magnetic resonance signal data received by the transmitting and receiving means;
   sequence control means for driving in a predetermined pulse sequence the slicing gradient magnetic field-generating means, the encoding gradient magnetic field-generating means, the reading gradient magnetic field-generating means, the transmitting and receiving means and the data acquisition means such that the magnetic resonance is excited each time an encoding step determined by the amplitude of the encoding gradient magnetic field is performed and that the data acquisition means acquires the magnetic resonance signal resulting from the magnetic resonance, the sequence control means carrying out with respect to one magnetic resonance image, two types of pulse sequences in which slicing gradient magnetic field pulses are opposite in polarity; and
   image reconstructing means for additively combining data acquired in the data acquiring means on the basis of the two types of pulse sequences and reconstructing said one magnetic resonance image on the basis of the additively combined data.

* * * * *